(12) United States Patent
Schmittmann et al.

(10) Patent No.: US 6,501,638 B1
(45) Date of Patent: Dec. 31, 2002

(54) SOLDERLESS, COAXIAL FEEDTHROUGH COMPONENT

(75) Inventors: Helmut Schmittmann, Giengen (DE); Gerhard Stelzl, Heidenheim (DE)

(73) Assignee: Epcos AG, Munich (DE)

(*) Notice: Subject to any disclaimer, the term of this patent is extended or adjusted under 35 U.S.C. 154(b) by 0 days.

(21) Appl. No.: 09/762,375

(22) PCT Filed: Aug. 4, 1999

(86) PCT No.: PCT/DE99/02446

§ 371 (c)(1),
(2), (4) Date: May 11, 2001

(87) PCT Pub. No.: WO00/08754

PCT Pub. Date: Feb. 17, 2000

(30) Foreign Application Priority Data

Aug. 7, 1998 (DE) .......................................... 198 35 843

(51) Int. Cl.[7] ................................................ H01G 4/35
(52) U.S. Cl. .................... 361/302; 361/311; 361/306.1; 361/321.1
(58) Field of Search ................................ 361/302, 307, 361/306.1, 329, 305, 303, 306.2, 306.3, 311, 309, 877, 301.2, 301.4, 321.1

(56) References Cited

U.S. PATENT DOCUMENTS

| 4,148,003 A | * | 4/1979 | Colburn et al. .............. 333/181 |
| 4,229,714 A | | 10/1980 | Yu |
| 4,314,213 A | * | 2/1982 | Wakino ....................... 333/182 |
| 4,424,551 A | | 1/1984 | Stevenson et al. |
| 5,040,091 A | * | 8/1991 | Yamaoka et al. |
| 5,272,415 A | * | 12/1993 | Griswold et al. |
| 5,333,095 A | * | 7/1994 | Stevenson et al. |
| 5,546,058 A | * | 8/1996 | Azuma et al. .............. 333/183 |
| 5,870,272 A | * | 2/1999 | Seifried et al. ............. 361/302 |
| 6,275,369 B1 | * | 8/2001 | Stevenson et al. .......... 361/302 |
| 6,414,835 B1 | * | 7/2002 | Wolf et al. |

FOREIGN PATENT DOCUMENTS

| DE | 40 25 159 A1 | 2/1992 |
| DE | 42 18 171 A1 | 12/1993 |
| DE | 44 16 350 A1 | 11/1995 |
| EP | 0 572 825 A1 | 12/1993 |

* cited by examiner

Primary Examiner—Chau N. Nguyen
Assistant Examiner—Nguyen Ha
(74) Attorney, Agent, or Firm—Fish & Richardson P.C.

(57) ABSTRACT

A solderless coaxial feedthrough component that has a metallic knit fabric contact element made of a mesh fabric inserted between a pressure element and a contact surface of the component.

26 Claims, 2 Drawing Sheets

SOLDERLESS, COAXIAL FEEDTHROUGH COMPONENT

TECHNICAL FIELD

The present invention concerns coaxial feedthrough components, such as coaxial feedthrough capacitors or coaxial feedthrough filters.

BACKGROUND

Until now, soft-solder connections or soldered-on contact elements have been used in coaxial feedthrough components, such as feedthrough capacitors or feedthrough filters, in order to electrically connect external electrodes of the component with the winding, for example, in the case of a feedthrough capacitor. Such soft-solder connections or soldered-on contact elements do, of course, provide for a good electrical connection between external electrodes and the winding. However, they have the disadvantage that considerable heat is produced during the soldering process, which has a damaging effect on temperature sensitive synthetic capacitor windings. Also, the specifications of radiofrequency tight contacts of the material are often difficult to realize with soft-solder connections or soldered-on contact elements which require a certain accessibility for tools.

SUMMARY

In one aspect, the invention is directed to a solderless coaxial feedthrough component that has a metallic knit fabric contact element (also referred to as mesh fabric) is inserted between a pressure element and the contact surface. The metallic knit fabric contact element is mechanically braced against a contact surface of components, for example, a capacitor winding, by means of a pressure element such that a reliable electrical contact is produced by means of this metallic knit fabric contact element between, for example, the capacitor winding and an electrode.

For this metallic knit fabric, a tin-plated or nickel-plated copper wire or another wire with good electrical conductivity is advantageously used. The feedthrough component may preferably be a coaxial feedthrough capacitor or a coaxial feedthrough filter.

The present invention can, consequently, provide a solderless coaxial feedthrough component with which it is possible to do without soft-solder connections or soldered-on contact elements and yet enables reliable, radio frequency tight contact of temperature sensitive components.

BRIEF DESCRIPTION OF THE DRAWINGS

The invention is explained in detail in the following with reference to the drawings.

DETAILED DESCRIPTION

Figure 1:
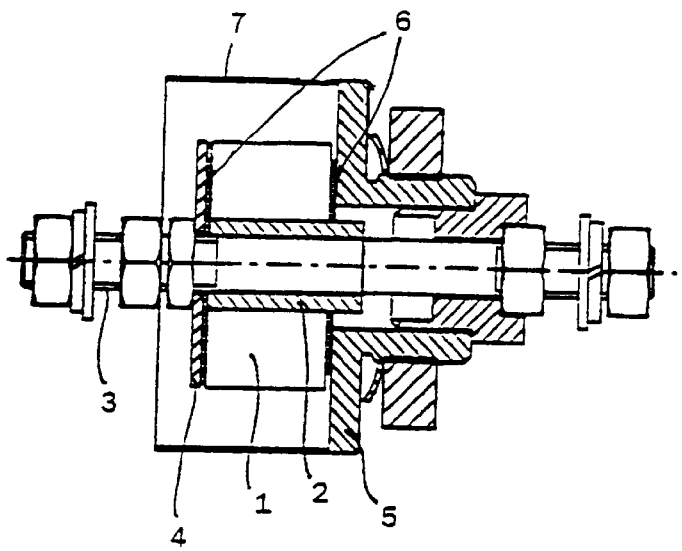
FIG. 1 depicts a sectional view through a coaxial feedthrough capacitor according to a first exemplary embodiment of the invention.

FIG. 1 depicts a coaxial feedthrough capacitor in which a synthetic capacitor winding 1 is provided as a feedthrough element through an insulating sheath or an inner tube on a threaded bolt 3. Between the synthetic capacitor winding 1 and a contact disk 4 on one side and between the synthetic capacitor winding 1 and a housing base 5 on the other side, a mesh fabric 6 made, for example, of copper is arranged in each case. These mesh fabrics 6 are braced between the synthetic capacitor winding 1 and the contact disk 4 and between the synthetic capacitor winding 1 and the housing base 5, respectively, by the tightening of screws on the threaded bolt 3. The capacitor winding 1 and its contact are then finally also surrounded by a housing 7 with the housing base 5, which provides for a radiofrequency tight seal.

In this manner, a solderless, gentle, concentric, radiofrequency tight contact of the temperature sensitive synthetic capacitor winding 1 is obtained.

Figure 2A:
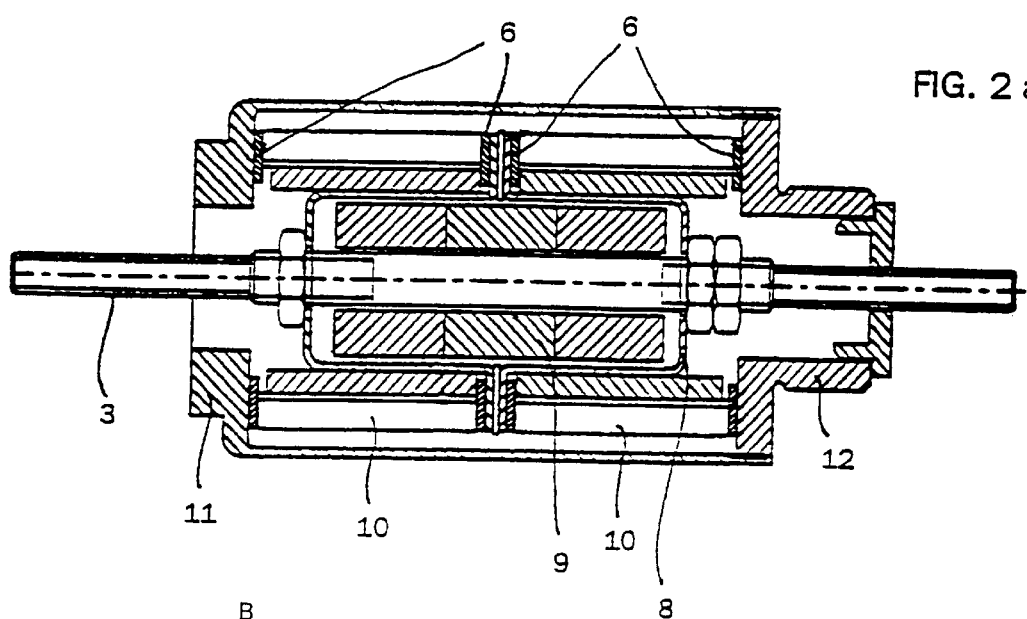
FIGS. 2a and 2b depict sectional views through a coaxial feedthrough filter according to a second exemplary embodiment of the present invention in two different variants.

FIG. 2a depicts, as another exemplary embodiment of the solderless coaxial feedthrough element according to the invention, a sectional view through a coaxial feedthrough filter with inductive components 9 and capacitor windings 10 provided in a contact cup 8, which are in contact via mesh fabrics 6 analogously as in the exemplary embodiment of FIG. 1. These mesh fabrics 6 are braced against the capacitor windings 10 by screw-tightening a housing case 11, which is screwed with a housing connector 12. The housing potential is applied via the "outer" mesh fabrics 6 in FIG. 2a, whereas the two "central" mesh fabrics 6 are each acted upon by the bolt potential via the contact cup 8.

Figure 2B:
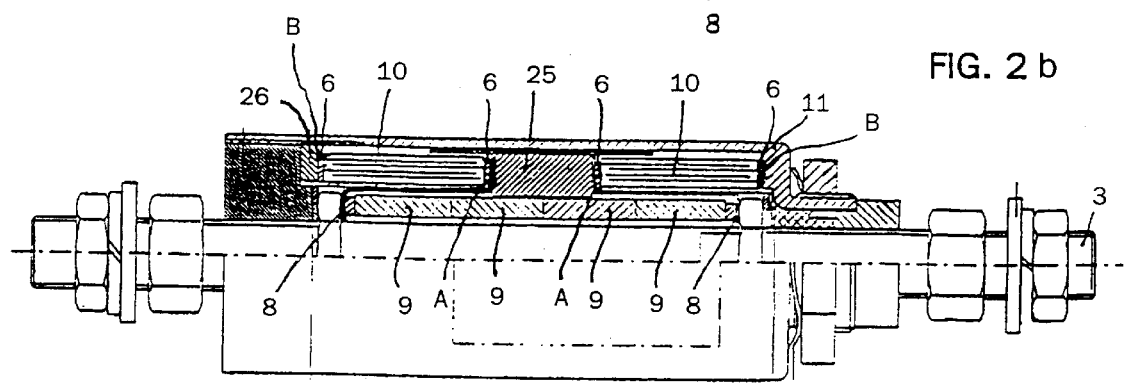

An insulating part 25 can possibly be provided between the two end parts of the contact cup 8 connected by the "central" mesh fabrics 6, as depicted in FIG. 2b. This insulating part 25 is used for electrical isolation. Here, for clarity, the left half of the contact cup 8 is depicted in bold. The bolt potential A is carried via this contact cup 8 and the mesh fabric 6, whereas the housing potential B is applied on the left end in FIG. 2b via a contact disk 26 and the mesh fabric 6. The winding packs are also braced in the housing by the contact disk 26 or the contact cup.

Figure 3:
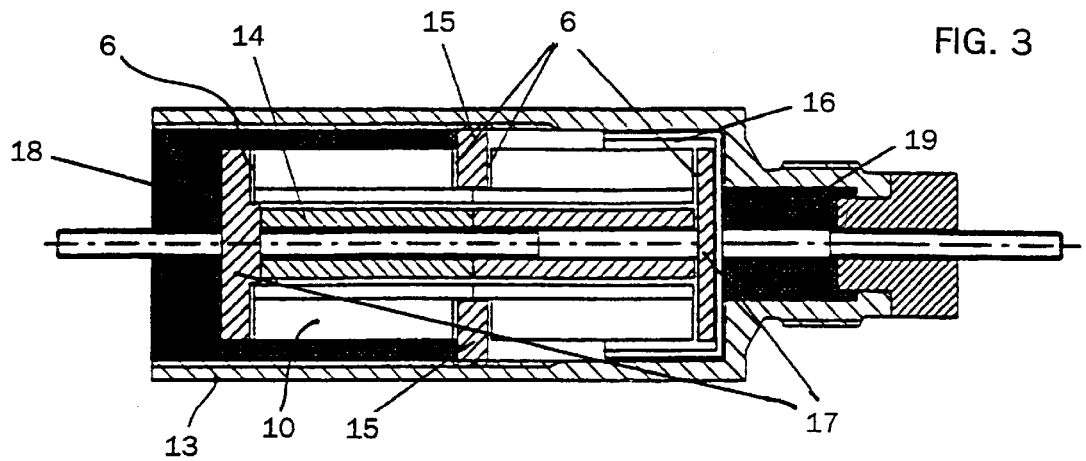
FIG. 3 depicts a sectional view of a feedthrough filter with a socket housing according to another exemplary embodiment of the invention.

FIG. 3 depicts a feedthrough filter with a socket housing 13, into which the complete assembly is screwed. This includes, in particular, the tubular core 14, windings 10, threaded housing contacts 15, and insulating cap 16, mesh fabrics 6, and bolt contacts 17. The housing contact 15 is in contact with a first winding potential, whereas the bolt contact 17 is provided against a second winding potential. The entire arrangement is installed moisture-tight in the socket housing 13 by means of a filling compound 18 and an adhesive coating 19. In this exemplary embodiment as well, the mesh fabrics 6 are pressed against the respective contact surfaces of the winding 10 such that a reliable solderless contact is provided.

Figure 4:
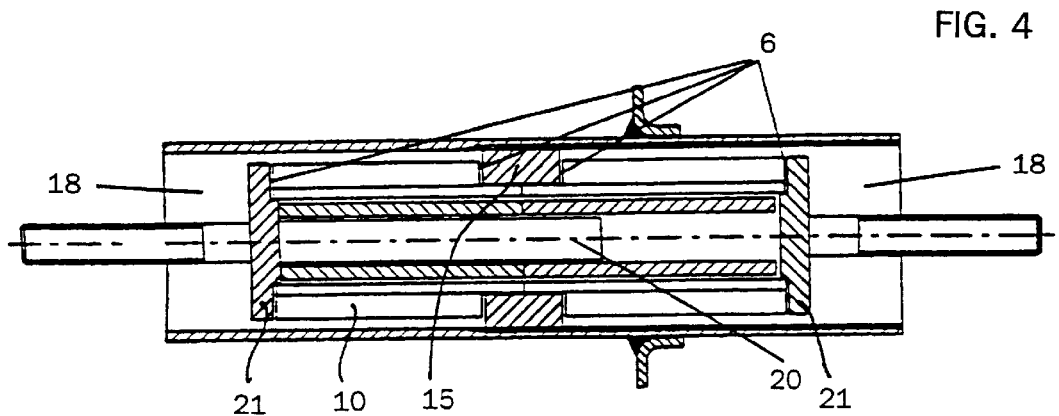
FIG. 4 depicts a sectional view of a feedthrough filter with a tubular housing according to another exemplary embodiment of the invention.

In the exemplary embodiment of FIG. 4, which also depicts an assembly 20 completely screwed into a housing (bolts, cores, windings, and contact disks) with a housing contact 15, windings 10, and filling compounds 18, mesh fabrics 6 also lie between contact and/or pressure elements or contact disks 21 and the windings 10 such that a reliable contact of the windings 10 with the pressure elements 21 is provided via the mesh fabrics 6. The same is true for the mesh fabrics 6 which are provided between the windings 10 and the housing contacts 15.

The exemplary embodiments of FIGS. 3 and 4 thus depict a screwed-in, mesh-contacted assembly 20 with one winding side each against a bolt potential, while simultaneously the two other winding sides are applied to housing potential. This is a completely solderless design in which the contact is made solely via the mesh fabrics 6.

In contrast to FIGS. 3 and 4, FIGS. 5 and 6 depict two other exemplary embodiments of the invention in which identical connection elements are connected with a choke 22 to bolt potential, while the contact of coils 10 is again made via mesh fabrics 6. Connection elements 23 to bolt potential are guided to the choke 22 via bolt contacts 24. Housing contacts 15 are against the mesh fabrics 6.

Figure 5:
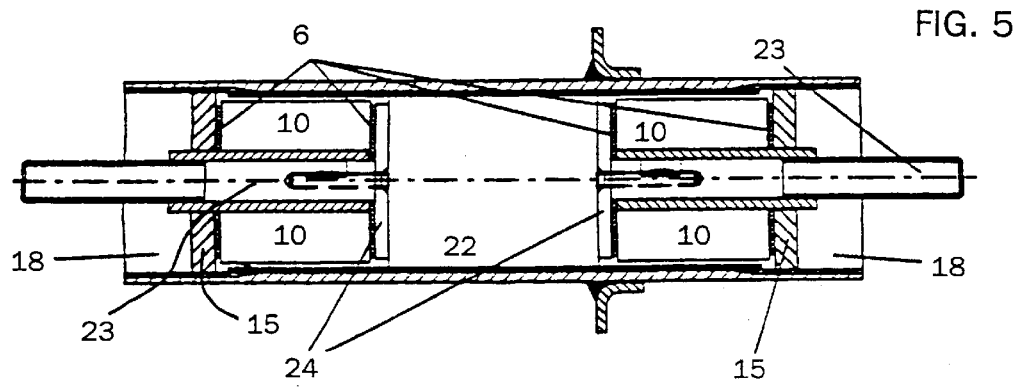
FIG. 5 depicts a sectional view of a feedthrough filter with a flange housing threaded at both ends according to another exemplary embodiment of the invention.
Figure 6:
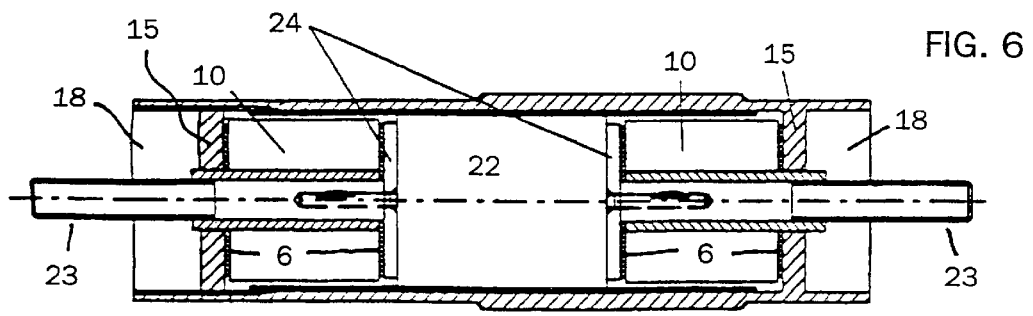
FIG. 6 depicts a sectional view of the feedthrough filter with a tubular housing threaded at one end according to another exemplary embodiment of the invention.

FIG. 5 depicts a flange housing threaded on both ends whereas a tubular housing threaded on one end is depicted in FIG. 6. Both housings are sealed on both ends by a filling compound 18.

What is claimed is:

1. A solderless coaxial feedthrough component, comprising:
   a housing;
   at least two electrodes inserted into the housing;
   at least one pressure element braced against a contact surface of the component; and
   a metallic knit fabric contact element inserted between the pressure element and the contact surface.

2. The solderless coaxial feedthrough component according to claim 1; wherein the metallic knit fabric contact element is made of metal wire with good conductivity.

3. The solderless coaxial feedthrough component according to claim 2, wherein the metallic knit fabric contact element is made of tin-plated copper wire.

4. The solderless coaxial feedthrough component according to claim 2, wherein the metallic knit fabric contact element is made of nickel-plated copper wire.

5. The solderless coaxial feedthrough component according to claim 2, wherein the component is a coaxial feedthrough capacitor.

6. The solderless coaxial feedthrough component according to claim 2, wherein the component is a coaxial feedthrough filter.

7. The solderless coaxial feedthrough component according to claim 2, wherein the housing is sealed by a filling compound.

8. The solderless coaxial feedthrough component according to claim 1, wherein the housing is sealed by a filling compound.

9. The solderless coaxial feedthrough component according to claim 1, wherein the housing is threaded on at least one side.

10. The solderless coaxial feedthrough component according to claim 1, wherein the housing is threaded on both sides.

11. The solderless coaxial feedthrough component according to claim 1, wherein the housing is selected from a socket housing, a tubular housing, and a flange housing.

12. The solderless coaxial feedthrough component according to claim 1, wherein the metallic knit fabric contact element is connected with a housing contact.

13. The solderless coaxial feedthrough component according to claim 12, wherein the metallic knit fabric contact element is connected with a bolt contact.

14. The solderless coaxial feedthrough component according to claim 1, wherein the metallic knit fabric contact element is connected with a bolt contact.

15. A solderless coaxial feedthrough component, comprising:
    a feedthrough element including at least two electrodes and a first contact surface;
    a first metallic knit fabric contact element in contact with the first contact surface;
    a first contact element urged into contact with the first metallic knit fabric contact element to electrically connect the first contact element and the feedthrough element; and
    a housing surrounding the feedthrough element and the first contact element.

16. The solderless coaxial feedthrough component of claim 15, wherein the housing includes a second contact element and wherein the feedthrough element includes a second contact surface, the component further comprising:
    a second metallic knit fabric contact element inserted between the second contact element and the second contact surface to electrically connect the housing and the feedthrough element.

17. The solderless coaxial feedthrough component of claim 16, wherein the first contact element is a contact disk, the component further comprising:
    a shaft extending through the housing and the feedthrough element, an outer surface of the shaft in contact with the contact disk.

18. The solderless coaxial feedthrough component of claim 17, wherein:
    the feedthrough element is situated between the first contact element and the second contact element;
    the shaft has a threaded outer surface and is at least partially surrounded by a threaded element; and
    the first contact element and the second element can be moved toward each other by tightening the threaded element on the threaded shaft to urge the contact elements and the contact surfaces of the feedthrough element into contact through the metallic knit fabric contact elements.

19. The solderless coaxial feedthrough component of claim 15, wherein the feedthrough element is a synthetic capacitor winding.

20. The solderless coaxial feedthrough component of claim 15, wherein the feedthrough element is a feedthrough filter.

21. A solderless coaxial feedthrough component, comprising:
    a shaft having an outer surface;
    an annular contact disk surrounding the shaft and in contact with the outer surface of the shaft;
    a first annular mesh fabric contact element surrounding the shaft and in contact with the contact disk;
    an annular feedthrough element surrounding the shaft and including first and second contact surfaces, the first contact surface in contact with the first mesh fabric contact element, such that an electrical connection is formed between the feedthrough element and the shaft through the mesh fabric element and the contact disk;
    a second annular mesh fabric contact element surrounding the shaft and in contact with the second contact surface of the feedthrough element; and
    a housing surrounding the contact disk and the feedthrough element, the housing including a housing contact surface in contact with the second mesh fabric contact element such that an electrical connection is formed between the housing and the feedthrough element.

22. The solderless coaxial feedthrough component of claim 21, further comprising:

an annular insulator inserted between the feedthrough element and the outer surface of the shaft.

23. The solderless coaxial feedthrough component of claim 21, wherein the feedthrough element is a feedthrough capacitor.

24. The solderless coaxial feedthrough component of claim 21, wherein the feedthrough element is a feedthrough filter.

25. A solderless coaxial feedthrough component, comprising:

- a feedthrough filter including at least one inductive component, at least one capacitor winding and a contact cup in contact with a shaft having an outer surface;
- a housing including a housing contact element braced against a first metallic knit fabric contact element;
- a first metallic knit fabric contact element inserted between the housing contact element and the capacitor winding to electrically connect the housing and the capacitor winding;
- a second metallic knit fabric contact element inserted between the contact cup and the capacitor winding to electrically connect the outer surface of the shaft and the capacitor winding.

26. A solderless coaxial feedthrough component, comprising:

- a feedthrough filter including at least one inductive component, a first and second capacitor winding and a contact cup in contact with a shaft;
- a housing surrounding the feedthrough filter and including a first contact disk and a second contact disk;
- a first metallic knit fabric contact element inserted between the first contact disk and the first capacitor winding, the first contact disk and the first capacitor winding urged toward each other, to electrically connect the housing and the first capacitor winding;
- a second metallic knit fabric contact element inserted between the second contact disk and the second capacitor winding, the second contact disk and the second capacitor winding urged toward each other, to electrically connect the housing and the second capacitor winding;
- a third metallic knit fabric contact element inserted between the first capacitor winding and the contact cup to electrically connect the shaft and the first capacitor winding;
- a fourth metallic knit fabric contact element inserted between the first capacitor winding and the contact cup to electrically connect the shaft and the second capacitor winding.

* * * * *

UNITED STATES PATENT AND TRADEMARK OFFICE
CERTIFICATE OF CORRECTION

PATENT NO. : 6,501,638 B1
DATED : December 31, 2002
INVENTOR(S) : Helmut Schmittmann and Gerhard Stelzl It is certified that error appears in the above-identified patent and that said Letters Patent is hereby corrected as shown below:

Title page,
Item [30], Foreign Application Priority Data, please replace "198 35 843" with
-- 198 35 843.1 --;

Column 3,
Line 28, replace ";" with -- . --.

Signed and Sealed this

Twentieth Day of April, 2004

JON W. DUDAS
*Acting Director of the United States Patent and Trademark Office*